US005543605A

United States Patent [19]
Kimrey, Jr. et al.

[11] Patent Number: 5,543,605
[45] Date of Patent: Aug. 6, 1996

[54] MICROWAVE FIBER COATING APPARATUS

[75] Inventors: Harold D. Kimrey, Jr.; William B. Snyder, Jr., both of Knoxville, Tenn.; Richard C. Krutenat, Belmont, Mass.

[73] Assignee: Avco Corporation, Providence, R.I.

[21] Appl. No.: 390,836

[22] Filed: Apr. 13, 1995

[51] Int. Cl.$^6$ .................................... H05B 6/70
[52] U.S. Cl. .................... 219/690; 219/691; 219/693
[58] Field of Search .................... 219/690, 693, 219/696, 695, 691; 427/27, 28, 35, 38, 249; 118/620–623, 724, 725

[56] References Cited

U.S. PATENT DOCUMENTS

| | | | |
|---|---|---|---|
| 2,771,666 | 11/1956 | Campbell et al. | 29/198 |
| 2,877,138 | 3/1959 | Vodonik | 117/93 |
| 3,551,199 | 12/1970 | Forster | 219/10.55 A |
| 3,555,232 | 1/1971 | Bleackley | 219/10.55 |
| 3,572,286 | 3/1971 | Forney | 219/10.55 A |
| 3,692,577 | 9/1972 | Evans | 117/225 |
| 3,754,112 | 8/1973 | DeBolt | 219/10.61 |
| 3,762,941 | 10/1973 | Hou | 117/93.1 |
| 3,851,131 | 11/1974 | Johnston et al. | 219/10.55 A |
| 3,887,722 | 6/1975 | Douglas et al. | 219/10.55 A |
| 4,101,411 | 7/1978 | Suzuki et al. | 219/10.55 A |
| 4,142,008 | 2/1979 | DeBolt | 427/249 |
| 4,197,282 | 4/1980 | Bailly–Lacresse et al. | 423/447.4 |
| 4,234,622 | 11/1980 | DuBuske et al. | 427/45.1 |
| 4,274,209 | 6/1981 | Kawagachi | 219/10.55 R |
| 4,306,897 | 12/1981 | Maklad | 65/3.12 |
| 4,344,983 | 8/1982 | Grange et al. | 427/46 |
| 4,532,199 | 7/1985 | Ueno et al. | 430/128 |
| 4,569,738 | 2/1986 | Kieser et al. | 204/173 |
| 4,666,736 | 5/1987 | Matsumura et al. | 427/52 |
| 4,724,159 | 2/1988 | Yamazaki | 427/451 |
| 4,777,090 | 10/1988 | Oshivnsky et al. | 428/408 |
| 4,824,690 | 4/1989 | Heinecke et al. | 427/38 |
| 4,863,760 | 9/1989 | Schantz et al. | 427/163 |
| 4,880,578 | 11/1989 | Holcombe et al. | 264/26 |
| 4,950,319 | 8/1990 | Lane et al. | 219/10.55 M |
| 5,013,130 | 5/1991 | Atkins et al. | 385/128 |
| 5,442,160 | 8/1995 | Kimrey et al. | 219/690 |

FOREIGN PATENT DOCUMENTS

| | | |
|---|---|---|
| 0016699 | 10/1980 | European Pat. Off. . |
| 2225907 | 11/1974 | France . |
| 2262470 | 9/1975 | France . |
| 1952987 | 5/1970 | Germany . |
| 007161 | 7/1958 | Japan . |
| 014505 | 11/1990 | Japan . |

OTHER PUBLICATIONS

Huang, Temperatrure Control in a Microwave Resonant Cavity System for Rapid Heating of Nylon Monofilament, Journal of Microwave Power, 11(4), 1976, pp. 305–313.

Huang, A Microwave Apparatus for Rapid Heating of Threadlines, Journal Microwave Power, 4(4). 1969, pp. 288–293.

Bertaud, et al., High Temperature Microwave Heating in Refractory Materials, Journal Microwave Microwave Power, 11(4), 1976, pp. 315–320.

Sutton, Microwave Processing of Ceramic Materials, Ceramic Bulletin, vol. 68, No. 2, 1989, pp. 376–386.

Palaith, et al., Microwave Joining of Ceramics, Ceramic Bulletin, vol. 68, No. 9, 1989, pp. 1601–1606.

Snyder, Microwave Sintering of Ceramics, Proceedings of the International Congress on Technology Exchange, 1989.

Ridged Waveguide Microwave Applicators, Bleackley, et al., Journal of Microwave Power, 7(1), pp. 23–28, 1972.

A Microwave Applicator for Filamentary Materials, A. L. Van Koughnett, Journal of Microwave Power, 7(1), pp. 17–22, 1972.

(List continued on next page.)

*Primary Examiner*—Tu Hoang
*Attorney, Agent, or Firm*—Mary E. Porter; Thomas L. Tully

[57] ABSTRACT

Apparatus for heating a fiber using microwave energy. The apparatus has a source of microwave energy feeding and applicator. The applicator is configured to concentrate the microwave energy on a chamber holding a fiber. Fibers made or coated using chemical vapor deposition in the apparatus are also disclosed.

9 Claims, 7 Drawing Sheets

OTHER PUBLICATIONS

Wave Propagation in Rectangular Waveguides with Symmetrically Placed Tapered Ridges, F. M. El–Sayed, et al., Journal of Microwave Power, 19(1), pp. 35–46, 1984.

The Design of Waveguides with Symmetrically Placed Double Ridges, E.V. Jull, et al., IEEE Transactions on Microwave Theory and Techniques, pp. 397–399, July 1969.

Ridged Waveguide Applicators for Uniform Microwave Heating of Sheet Materials, El–Sayed, et al., Journal of Microwave Power, 19(2), pp. 112–113, 115–117, 1984.

A study of Microwave Texturing of Polyester Yarns, Kimrey, et al., Digest Microwave Power Symposium, 1981, pp. 52–54.

MICROWAVE FIBER COATING APPARATUS

This application relates generally to the manufacture of fibers and more particularly to the use of microwave heating in a cold-wall reactor for CVD on continuous filaments.

Fibers are used in many applications where high strength and low weight are required. Fibers may be in many forms such as, yarns or continuous filaments.

For example, fibers, especially continuous filaments, are used in some aircraft parts. In one common use of fibers, the fibers are incorporated into a metal or ceramic matrix. The fibers provide strength, stiffness or toughness to the matrix. Such composites have more useful physical and mechanical properties than the matrix materials alone.

Such reinforcing filaments are often made by coating a core with materials which provide desirable properties, such as strength and stiffness. In some instances, further coatings are applied to make the fiber more compatible with specific matrix materials. Herein, the term "fiber" will be used generically to describe a fiber being made or coated even though strictly speaking fibers made by coating a core do not exist until after the coating has been applied.

One common way to apply coatings is called chemical vapor deposition (or CVD). In a CVD process, the fiber is passed through a chamber, such as a quartz tube, and heated. The chamber is filled with gases which react at the heated surface of the fiber and deposits are formed as the result of the chemical reaction. In a hot-wall system, the fiber is heated because the chamber itself is heated. Hot-wall systems suffer from the disadvantage that coatings are deposited on the walls of the chamber as well as on the fiber. The chamber becomes clogged with deposits and must be cleaned often.

In a cold-wall system, the fiber itself is heated. Deposition of materials, thus occurs more on the fiber than on the walls of the chamber. Generally, the fiber is heated by passing an electric current through the fiber, causing resistive heating.

To pass current through the fiber, electrical contact is made to the fibers at the ends of the chamber. Typically, the fiber passes through a small hole in the bottom of a well. The well is filled with mercury, which seals the gasses inside the chamber as well as provides electrical connection to the fiber.

Though commercial quantities of fibers, particularly continuous filaments, are coated in existing cold-wall systems, such systems have drawbacks. One such drawback is that insulative fibers cannot be coated since no electrical current can be induced in the fiber. Likewise, insulative coatings cannot be deposited since once the coating starts to form there would be no conducting path through the fiber. Another drawback is that highly conductive coatings cannot be deposited either. Once the coating starts to form, the resistance of the fiber drops and effective resistance heating is not possible. The same result occurs if a weakly conductive coating is deposited in a thick layer. The resistance drops as the coating gets thicker.

Also, the use of mercury seals has attendant disadvantages. The mercury may introduce impurities into the fiber coating.

U.S. Pat. No. 3,754,112 to DeBolt describes one approach to avoid some of the shortcomings of resistive heating. That patent shows RF energy used to induce currents at various places in a fiber. The approach increased or augmented conventional resistive heating of the fiber. This approach is useful to slightly increase resistive heating as thick, weakly conductive coatings are added. However, such a system, because it still employs resistive heating, suffers from many of the disadvantages enumerated above. Further, the system uses relatively high levels of RF radiation. Such radiation creates its own problems, such as interference with communication equipment and is cumbersome to shield effectively when used in CVD systems.

SUMMARY OF THE INVENTION

With the foregoing background of the invention in mind, it is an object of this invention to provide an apparatus for non-resistive heating of fibers.

It is also an object to provide an apparatus for heating insulating fibers.

It is further an object to provide apparatus for coating fibers.

It is yet another object to provide a method for depositing insulating coatings on fibers.

The foregoing and other objects are achieved in a Chemical Vapor Deposition (CVD) reactor wherein fibers are heated by microwaves. The reactor comprises a gas filled chamber through which fiber passes. The chamber is partially disposed in a microwave applicator. In one embodiment, the microwave applicator comprises a long rectangular box supporting propogation of microwaves with a means for concentrating the electric field around the chamber. In a second embodiment, the applicator comprises a triangular region with the chamber in front of the apex. A plurality of cavities open into the triangular region. Each cavity has an antenna disposed in it coupling microwave energy into the cavity. Between each cavity and the triangular region a rotating paddle is disposed.

With apparatus according to the invention, gas is introduced into the chamber. The fiber is heated by the microwaves and materials from the gas combine to make solids, which are deposited on the fiber.

BRIEF DESCRIPTION OF THE DRAWINGS

The invention will be better understood by reference to the following detailed description and accompanying drawings in which.

DESCRIPTION OF PREFERRED EMBODIMENTS

Figure 1:
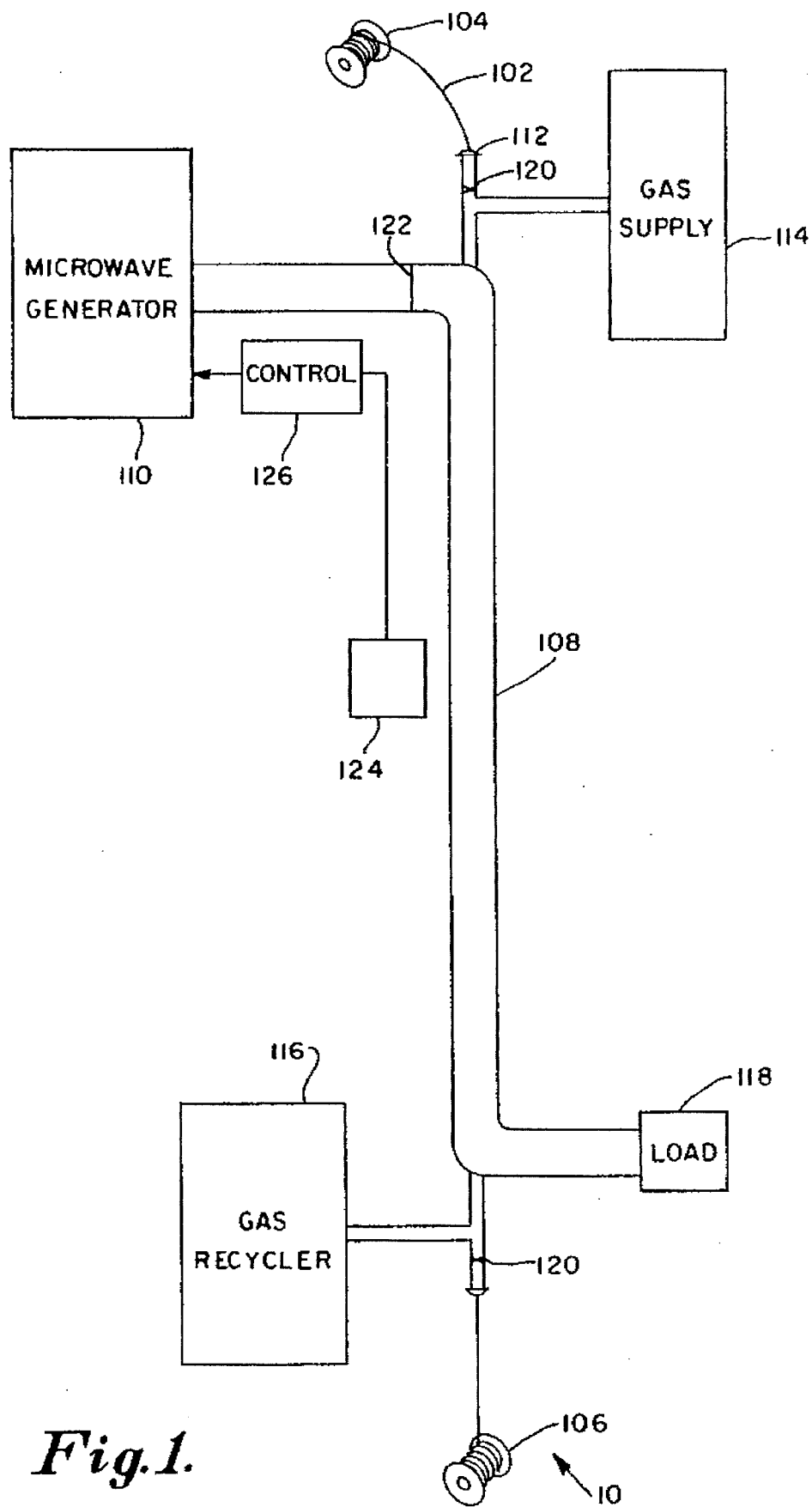
FIG. 1 is a block diagram of one embodiment of the invention.

FIG. 1 is a block diagram of a system 10 for depositing coatings on fiber 102. Uncoated fiber is supplied on spool 104. Coated fiber is taken up on spool 106.

Fiber 102 enters a Chemical Vapor Deposition ("CVD") chamber, here quartz tube 112. Tube 112 is of the type conventionally used for CVD on fibers. As in conventional systems, gas supply 114 introduces gases into tube 112. Those gasses are used in the CVD process as described in more detail below. The unused gasses flow to gas recycler 116 where they are either processed for reuse or disposal.

Gas is kept inside tube 112 by seals 120. Seals 120 allow fiber 102 to pass through tube 112, but allow virtually no gas to escape. Seals 120 may be jeweled seals as known in the art. The seals might also be gas seals of the type hereafter defined. Preferably, seals which do not require mercury or other liquid metal are used, since according to the invention no electrical contact is required. Liquid metal residue on fiber 102 may interfere with microwave heating as hereafter described.

Tube 112 runs through applicator 108. Microwave energy is fed to applicator 108 from microwave generator 110. This microwave energy heats up fiber 102, causing deposition of a coating on fiber 102. Microwave energy not absorbed in applicator 108 is dissipated in load 118 of conventional type.

The frequency and power provided by microwave generator 110 depends on many factors and may need to be empirically determined. Here, a generator capable of producing microwave energy at a frequency of 2.45 GHz at power levels adjustable up to around 6 kWatts was used. However, it is predicted that a generator producing maximum power levels up to around 3 kWatts could also be used.

Mylar sheet 122 separates microwave generator 110 from applicator 108, but allows microwaves to travel into applicator 108. If microwave generator 110 contains a cooling fan (not shown), mylar sheet 122 prevents the fan from cooling fiber 102 in applicator 108.

Figure 2:
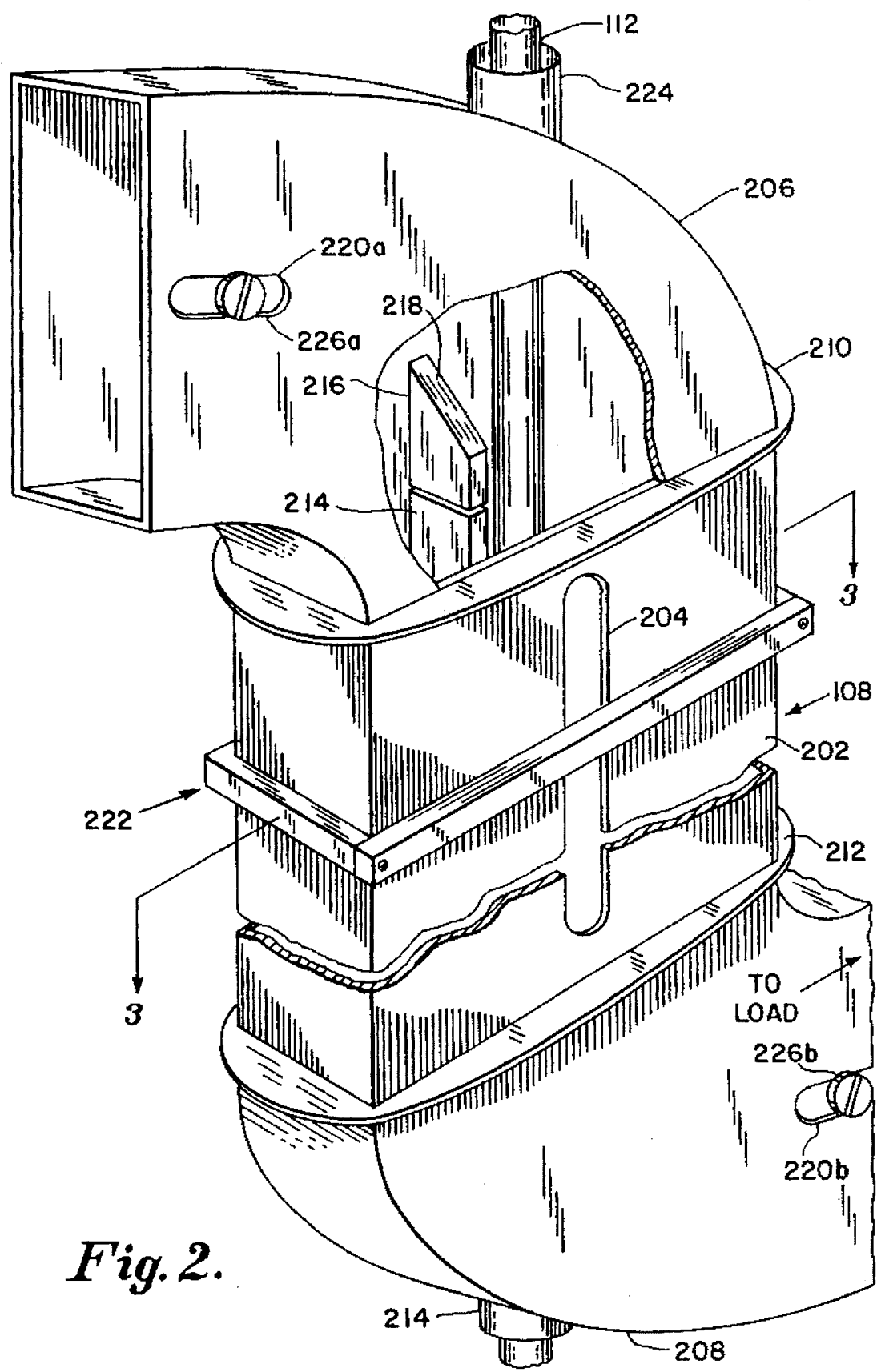
FIG. 2 is an isometric view, partially cut away of the waveguide applicator shown in FIG. 1.

Turning now to FIG. 2, details of applicator 108 may be seen. Applicator 108 contains relatively long conducting box 202. Box 202 is made from a conventional waveguide, here roughly five feet long. The length is not critical. The walls of the waveguide have lengths in a ratio of 3:1. Such a waveguide supports propagation in the $TE_{10}$ mode.

The waveguide has however, been modified. A slot 204 is cut in one surface of the waveguide. A second slot (308, FIG. 3) is cut in the opposite surface of the box 202.

Slot 204 allows viewing of fiber 102 (FIG. 1) in tube 112. Slot 308 (FIG. 3) allows projection 214 to extend into box 202.

Projection 214 is made of a conducting material and is as close to fiber 102 as practical. Projection 214 is a means to increase the electric field density inside tube 112. Increasing the electric field density increases the absorption of microwaves by fiber 102 (FIG. 1) and facilitates heating of fiber 102 (FIG. 1).

Support structures are used to control the shape of box 202. Here, brace 222 is used. Several such braces might be needed along the length of box 202, but only one brace 222 is shown for clarity.

Figure 3:
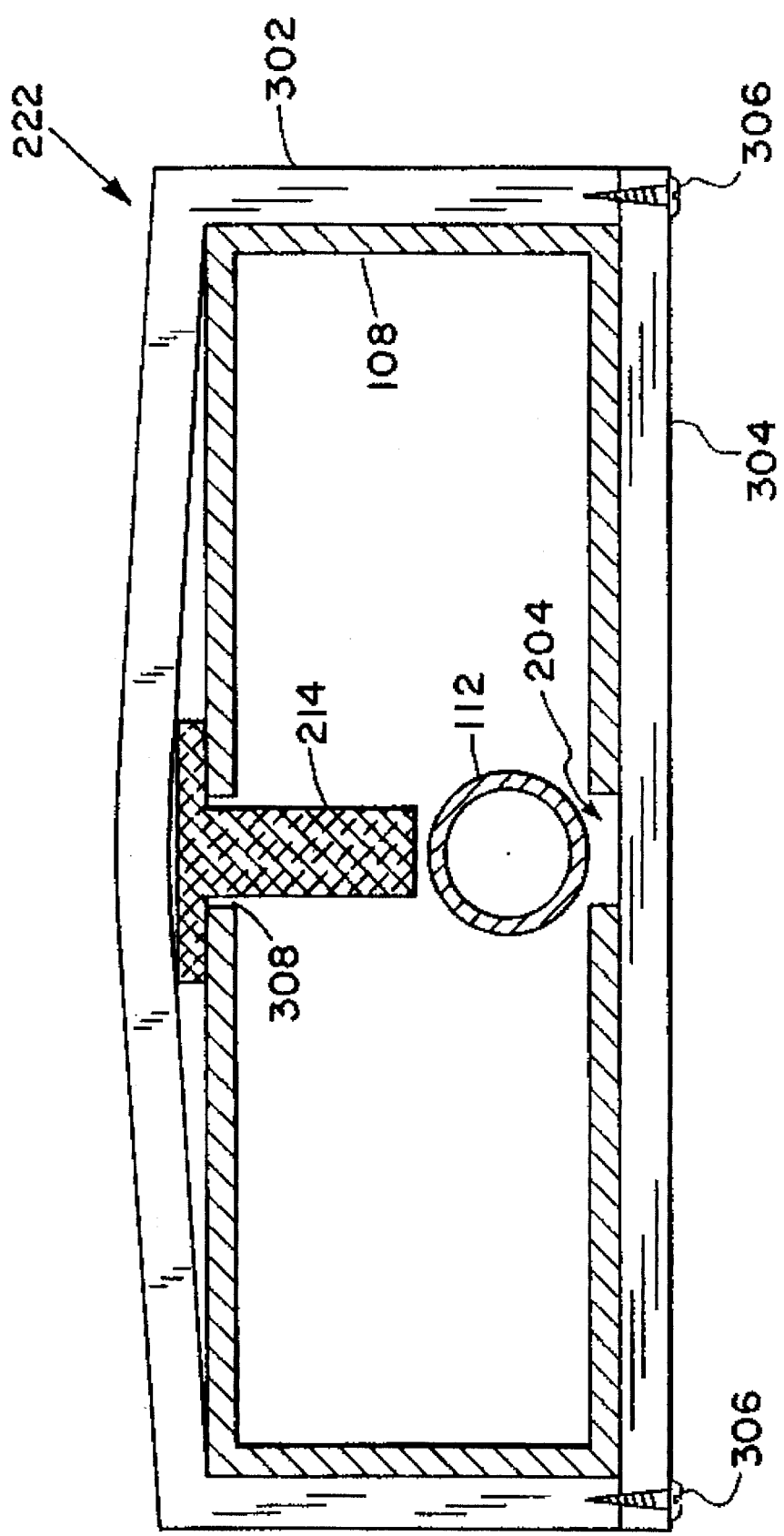
FIG. 3 is a cross section through the waveguide applicator along the line 3—3 in FIG. 2.

FIG. 3 shows across section of box 108 taken through brace 222. As shown, brace 222 is made up of a bracket 302 and a bar 304. Bracket 302 and bar 304 are held together by screws 306 as indicated. Tightening screws 306 pulls bracket 302 and bar 304 together, thereby slightly changing the shape of box 108. Thus, screw 306 provide a means to tune box 108 for propagation of microwaves.

Also, it can be seen in FIG. 3 that projection 214 is a piece of a "T" shaped piece projecting through slot 308. Tightening screws 306 also draws projection 214 closer to tube 112.

Returning to FIG. 2, each end of box 202 is connected to a curved section 206 or 208. Curved sections 206 and 208 are made from curved pieces of waveguide as is commercially available. Curved sections 206 and 208 are joined to box 202 at flanges 210 and 212, also as conventionally used in microwave equipment.

Curved sections 206 and 208 have been modified to include a hole (not shown) through which tube 112 passes. Each hole (not shown) is surrounded by sleeve 224. The sleeve has a length of approximately one quarter of a wavelength of the microwave energy. Thus, the impedance into each hole is very large and very little microwave energy passes through the hole.

Slots 220a and 220b in curved sections 206 and 208, respectively, are for the purpose of tuning applicator 108. It is desirable that applicator 108 be tuned to present an impedance to microwave generator 110 (FIG. 1) which minimizes reflected power. Pins 226a and 226b can be moved in slots 220a and 220b to adjust the impedance to a desirable level. The desirable level may be determined empirically by moving pins 226a and 226b and observing the reflected power by means of a reflected power meter (not shown) at microwave generator 110 (FIG. 1). Pins 226a and 226b are simply conducting screws which can be adjusted in length extending into the waveguide as well as in position.

Curved section 206 is shown to have soldered to its back wall a projection 216 which aligns with projection 214. Projection 216 ensures that the region in which the electric field is concentrated extends as far up tube 112 as possible.

It should be noted that projection 216 has a tapered edge 218. Tapered edge 218 is tapered at an angle of approximately 15 degrees with respect to the back wall of curved section 206. Tapered edge 218 reduces reflections of microwave energy from projection 216.

A similar arrangement of a projection with a tapered edge aligning with projection 214 is incorporated in section 208. For clarity, that projection is not explicitly shown.

Applicator 108 is constructed using techniques familiar to those skilled in the art of manufacturing microwave equipment. Those techniques are not explicitly described herein.

The following examples indicate some of the ways the system (FIG. 1) can be used to coat fibers.

EXAMPLE I

A 142 micron diameter silicon carbide monofilament such as shown in U.S. Pat. No. 4,340,636 was coated with boron nitride (BN) to a thickness of 4.3 microns. The waveguide 108 was approximately 25 inches in length. Gas supply 114 provided a mixture of nitrogen (one liter/min), borontrichloride (200 sccm), ammonia (300 sccm) and hydrogen (200 sccm). Microwave generator 110 provided approximately 1800 W to heat the fiber to a temperature between 1450° C. and 1650° C. The fiber was moved at a rate of 4 ft./min. Thinner coatings were obtained by moving the fiber at speeds up to 40 ft/min.

EXAMPLE II

A boron nitride coating was produced similar to Example I except boron trichloride was provided at 22 sccm and ammonia was provided at 50 sccm and nitrogen was provided at 250 sccm. The fiber was moved at a rate of 15–17 ft./min. and a BN coating 1.5 microns thick was deposited.

The selection of input gases in examples I and II produced deposits on the walls of tube 112 which required cleaning after a few hours of operation. To avoid these coatings, the reagent gases might be changed to be a mixture of diborane and ammonia. Alternatively, trimethyl boron and ammonia might be used. Also, trimethyl borate and ammonia could be used. Some of these materials are liquids at room temperature and require that gas supply 114 be heated to provide a suitable vapor pressure.

EXAMPLE III

Using the same gasses as in example 1, a 2 to 3 mil boron nitride coating was applied on a 33 micron carbon monofilament.

EXAMPLE IV

Silicon nitride was coated on a silicon carbide monofilament using a mixture of silicon tetrachloride and ammonia.

EXAMPLE V

A silicon oxycarbonitride coating on a silicon carbide monofilament can be produced with gas supply 114 supplying nitrogen bubbled through hexamethyldisilazane.

EXAMPLE VI

A boron nitride coating can be applied to a core made from a monofilament of alumina doped with iron according to the process conditions in Example I.

Figure 4:
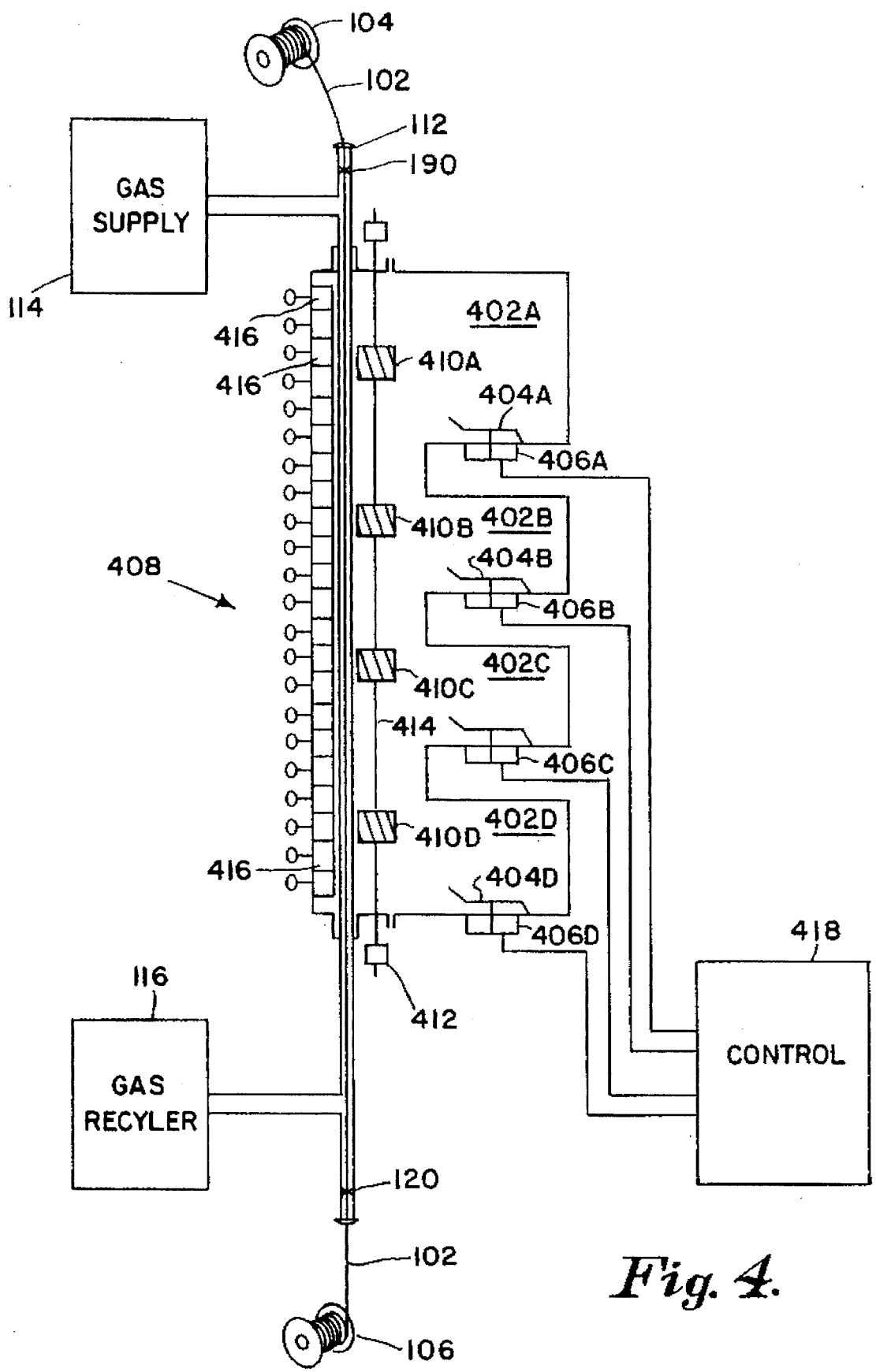
FIG. 4 is a block diagram of second embodiment of the invention.

Turning now to FIG. 4, an alternative embodiment of the invention is shown. Applicator contains tube 112 with fiber 102 passing through it from spool 104 to spool 106. Gas supply 114, gas recycler 116 and seals 120 function as previously described to provide a source of reagents for coating fiber in applicator 408.

Applicator 408 comprises a plurality of cavities 402A . . . 402D. On the floor of each cavity 402A . . . 402D is an antenna 404A . . . 404D, respectively, which couples microwave energy into each cavity. Antennas 404A . . . 404D can be rotated to an optimum position to distribute microwave energy uniformly into the cavities. The optimum position may be empirically determined.

Microwave units 406A . . . 406D generate microwaves, such as through the use of a magnetron (not shown) and couple them to antennas 404A . . . 404D, respectively. Microwave units 406A . . . 406D also each contain an externally controlled motor to rotate antenna 404A . . . 404D, respectively.

Here, cavities 402A . . . 402D, antennas 404A . . . 404D and microwave units 406A . . . 406D were formed by stacking four commercially available home microwave ovens one on top of the other. These units were modified for control purposes as herein described.

Control electronics 418 control the generation of microwave radiation by microwave units 406A . . . 406D. As in a conventional microwave oven, control electronics 418 can turn each magnetron (not shown) off or on. In addition, control electronics 418 can adjust the level of power produced by each magnetron (not shown). This adjustment is accomplished using known techniques such as by adjusting the instant heater current and plate voltage to the magnetrons.

Microwave energy fed into any one of the cavities 402A . . . 402D will couple into the other three cavities. Without modification, energy coupled into a cavity will be coupled to microwave unit 406 attached to that cavity. This coupling could present enough energy in the cavity to damage the magnetron (not shown) feeding that cavity. To prevent this damage, control electronics 418 control the magnetrons in microwave units 406A . . . 406D such that only one is turned on at any given time.

At the mouth of each cavity 402A . . . 402D is disposed a paddle 410A . . . 410D, respectively. Paddles 410A . . . 410D are mounted on shaft 414. Motor 412 rotates shaft 414. In operation, paddles 410A . . . 410D disperse microwave energy emanating from cavities 402A . . . 402D.

FIG. 4 shows a plurality of tuning vanes $416_1$ . . . $416_n$ positioned near tube 112. Each of tuning vanes $416_1$ . . . $416_n$ may be adjusted to be closer or further from tube 112. Tuning vanes $416_1$ . . . $416_n$ are metal and serve to concentrate the electric field in their vicinity. In operation, certain ones of vanes $416_1$ . . . $416_n$ are adjusted to be closer to tube 112 in regions where fiber 102 is heated to below average temperature while others of vanes $416_1$ . . . $416_n$ are adjusted to be further from tube 112 in regions where fiber 102 is heated to above average temperature. In this fashion, the temperature of fiber 102 is made more uniform.

Figure 5:
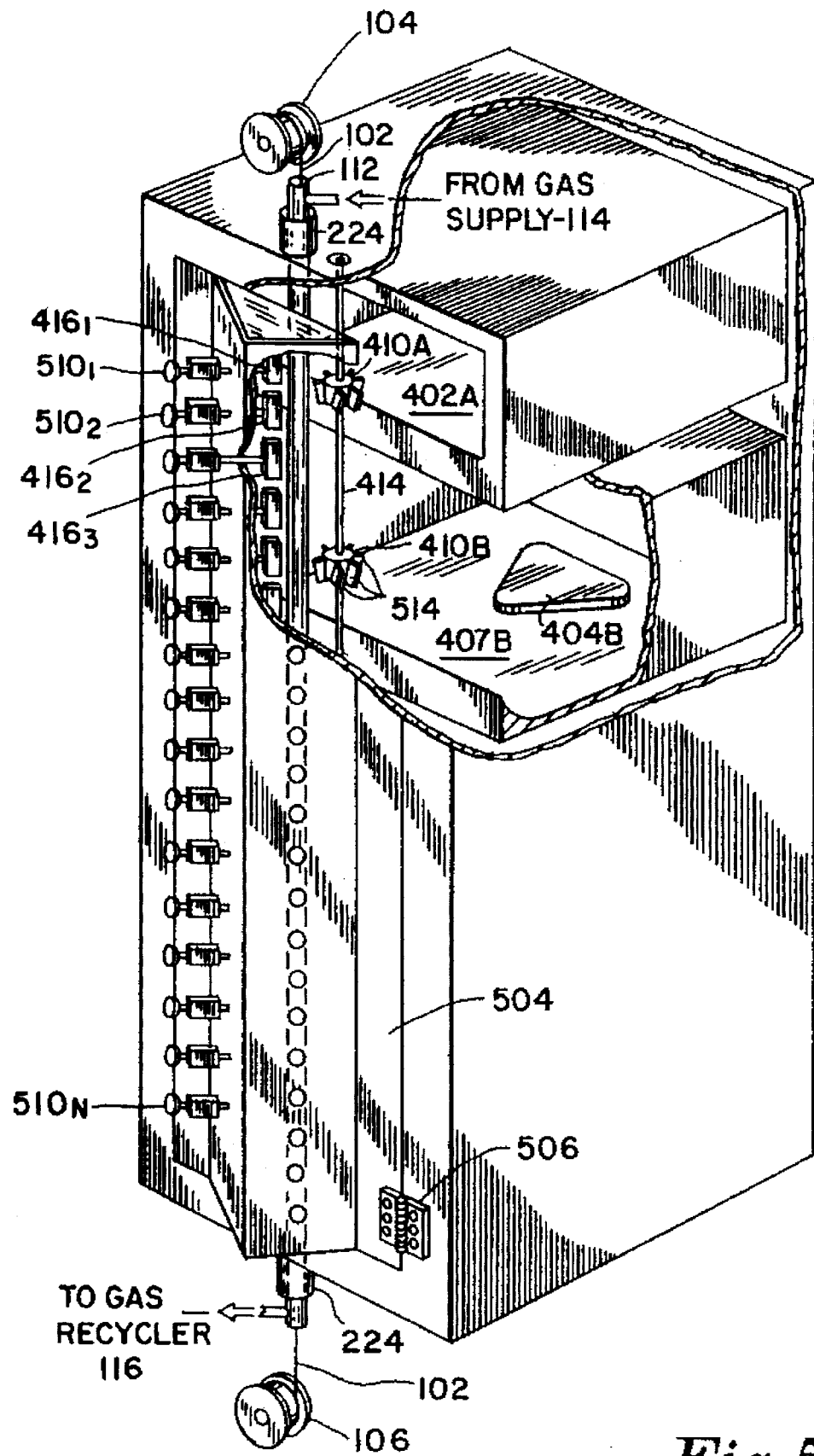
FIG. 5 is an isometric view, partially cut away, of the applicator of FIG. 4.

Turning to FIG. 5, an isometric view of applicator 408 is shown. Cavities 402A . . . 402D are enclosed in a housing 502. Access can be obtained to housing 502 via door 504 which is hinged via hinges 506.

Door 504 has a triangular section 508. Tuning vanes $416_1$ . . . $416_n$ are mounted with set screws $510_1$ . . . $510_n$ to be adjustable as described above.

The other side of triangular section 508 contains a plurality of holes 512. Holes 512 have a diameter smaller than a wavelength so that no microwave radiation passes through holes 512. Holes 512 allow observation of fiber 102.

Tube 112 is disposed close to triangular section 508 closest to the apex of triangular section 508. This positioning facilitates the focusing of microwave energy toward tube 112.

Where tube 112 exits housing 508, it is surrounded by a one quarter wavelength sleeve 224. This sleeve prevents the release of microwave radiation from the enclosure.

FIG. 5 shows paddles 410 to have a plurality of blades 514. Blades 514 are mounted at an angle of approximately 30 degrees with shaft 414. This orientation improves the dispersion of microwaves energy along the length of tube 112.

Figure 6:
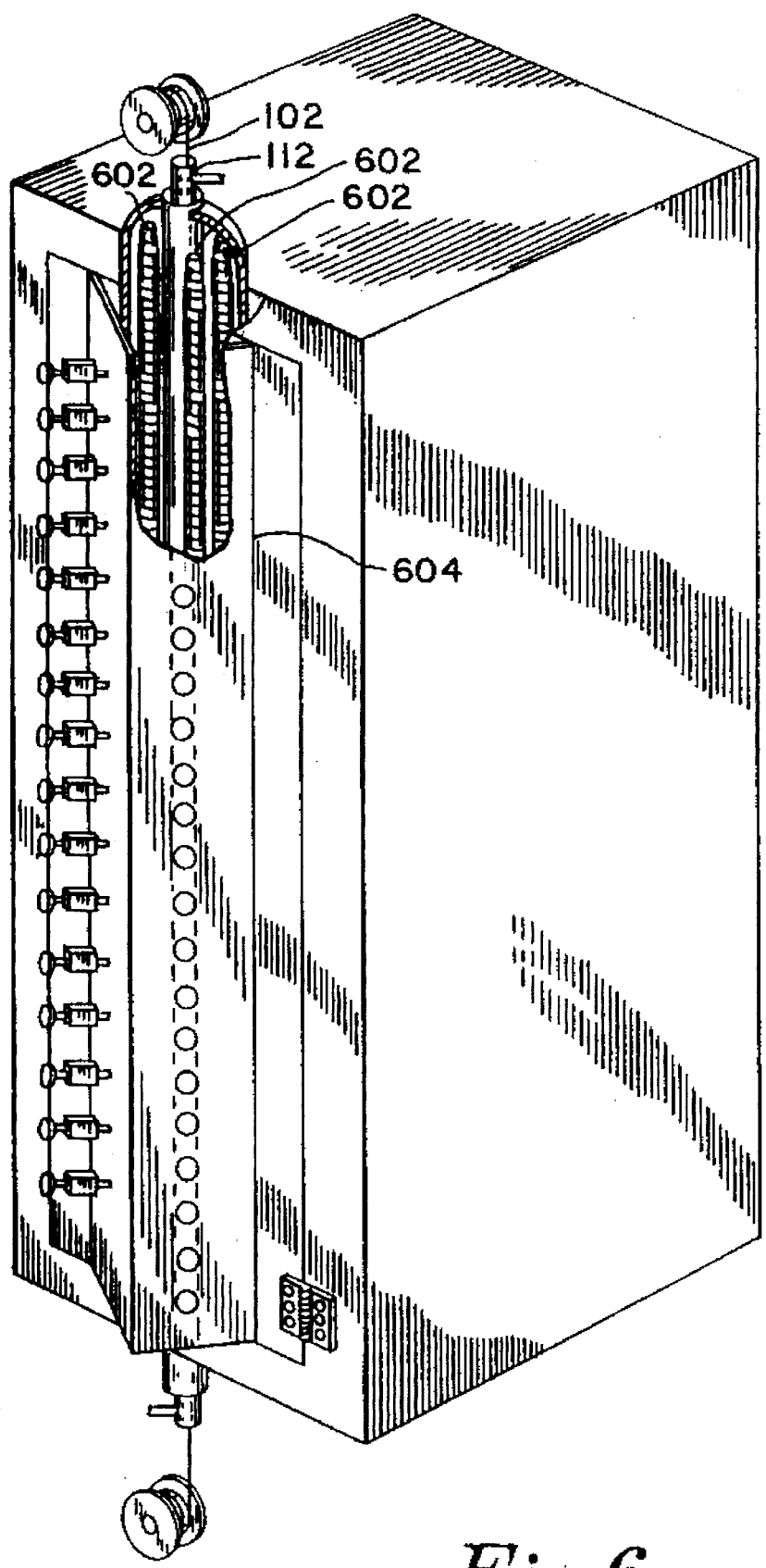
FIG. 6 is an isometric view, partially cut away, of the applicator of FIG. 4 showing additional features of the invention.

Turning to FIG. 6, another feature of the invention may be seen. FIG. 6 shows three electric resistance heating elements 602 disposed around tube 112. Heating elements 602 and tube 112 are surrounded by a sheet of insulation 604. Insulation 604 serves to keep the heat from heating elements 602 near tube 112.

Insulation 604 is a castable silica ceramic material cast shaped as a tube. The tube of insulation is split along its length to allow positioning around tube 112 and heating elements 602. This material is largely transparent to microwaves and has no effect on microwaves which heat fiber 102. Heating elements 602 are conventional rod shaped, metal sheathed heating elements. The metal sheath is at ground potential via connection to box 502. They also do not impact the microwaves heating fiber 102 because they are at ground potential.

Heating elements 602 and insulation 604 can heat fiber tube 112 apart from any heating caused by microwaves. Heating elements 602 can be used to heat tube 112 and thereby prevent the condensation of reagents or byproducts on tube 112.

Figure 7:
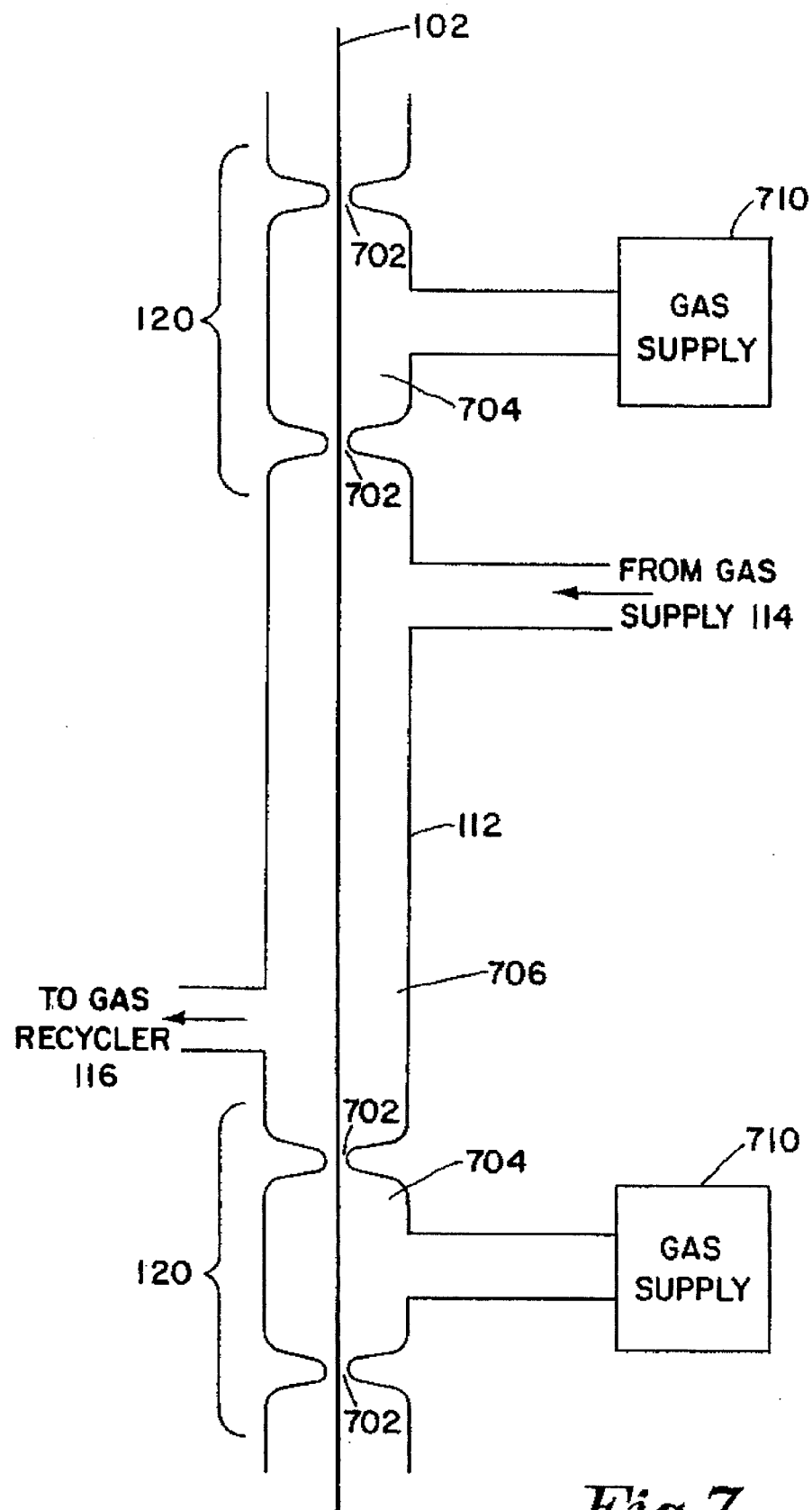
FIG. 7 is a schematic diagram of gas seals according to the invention.

Turning now to FIG. 7, additional details of seals 120 may be seen. Seals 120 are here referred to as gas seals because no mercury is used.

Each seal 120 comprises two small openings 702 in tube 112. The openings define the boundaries of chamber 704. Gas is supplied to chamber 704 from gas supply 710. Here, the gas supplied is nitrogen, but any inert, non-toxic gas could be used. Gas supply 710 keeps the gas in chamber 704 at a pressure slightly above atmospheric pressure, and above the pressure of gas in tube 112.

Gas recycler 116 (FIG. 1) keeps the pressure in chamber 706 slightly below atmospheric pressure. In operation, reagent gasses from gas supply 114 stay in chamber 706 because of the pressure difference between chambers 706 and 704. The gas which leaks out of seals 702 is a non-toxic, inert gas. Any gas which passes from chamber 704 to 706 has no effect on the operation of the applicator since the gas supplied by gas supply 710 is inert.

Having described embodiments of the invention, one of skill in the art may appreciate that various alternative embodiments could be constructed with departing from the invention. For example, FIG. 1 shows a two color pyrometer 124 positioned near applicator 108. Slot 204 (FIG. 2) or holes 512 (FIG. 5) allow pyrometer 124 to measure the temperature of fiber 102. Based on this measurement, control electronics 126 can vary the power out of microwave generator 110. In this way, the temperature of fiber 102 can be maintained at a constant level. Control electronics and methods of controlling the power from a microwave generator are known.

As another example of possible variations, the number of paddles 410 could be changed. Projection 216 need not be present. If it is not, projection 214 is simply tapered at its ends. Other modifications might make the apparatus easier to use. For example, the entire front portion of applicator 108 (FIG. 2) might be hinged to allow easy insertion of tube 112. Also, it was described that vanes 416 were adjusted to provide a uniform temperature profile. However, the vanes could also be adjusted to provide a nonuniform temperature profile. Additionally, specific examples of making or coating monofilaments were disclosed. The invention could be employed with yarns, tows, multifilaments, or other types of fibrous materials. It is felt, therefore, that the invention should be limited only by the appended claims.

What is claimed is:

1. A method of heating a fiber comprising the steps:
    a) providing an apparatus comprising
        i) a source of microwave energy, the microwave energy having an electric field associated therewith; and the electric field situated perpendicular to the fiber;
        ii) an applicator having walls defining a cavity adapted to have the fiber passed therethrough, the applicator coupled to the source of microwave energy;
        iii) means for concentrating a maximum electric field on the fiber, comprising an element projecting into the cavity;
        iv) means for tuning the electric filed in a longitudinal direction along the fiber to yield a uniform electric field along the fiber; and
    b) pulling the fiber through the cavity in the apparatus at a rate effective to permit the fiber to be heated sufficiently to coat the fiber by means of a chemical vapor deposition reaction.

2. The method of claim 1 wherein the step of pulling the fiber comprises pulling the fiber at a speed in excess of 4 ft/min.

3. The method of claim 2 wherein the step of pulling the fiber comprises pulling the fiber at a speed of 40 ft/min.

4. The method of claim 1 wherein said cavity is a rectangular waveguide and said element is projecting into the waveguide; further comprising the step of:
    c) introducing microwave energy into the waveguide.

5. The method of claim 1 in which the fiber comprises silicon carbide monofilament.

6. The method of claim 1 in which the fiber comprises monofilament of alumina doped with iron.

7. The method of claim 1 in which said chemical vapor deposition reaction coats the fiber with boron nitride.

8. The method of claim 1 in which said chemical vapor deposition reaction coats the fiber with silicon nitride.

9. The method of claim 1 in which said chemical vapor deposition reaction coats the fiber with silicon oxycarbonitride.

* * * * *